United States Patent [19]
Ohmine et al.

[11] Patent Number: 5,991,508
[45] Date of Patent: Nov. 23, 1999

[54] THERMAL PROCESSING APPARATUS WITH A SHIELD BETWEEN HEATER AND SUBSTRATE

[75] Inventors: Toshimitsu Ohmine, Tokyo, Japan; Martin Schrems, New York, N.Y.

[73] Assignee: Kabushiki Kaisha Toshiba, Japan

[21] Appl. No.: 08/806,678

[22] Filed: Feb. 26, 1997

[30] Foreign Application Priority Data

Feb. 29, 1996 [JP] Japan ............................. P08-043648

[51] Int. Cl.⁶ .................................................. F26B 3/30
[52] U.S. Cl. ........................ 392/418; 392/416; 118/724; 118/725
[58] Field of Search ..................... 392/418, 416, 392/407; 219/405, 408, 416, 390, 411; 118/724, 725, 50.1

[56] References Cited

U.S. PATENT DOCUMENTS

| | | | |
|---|---|---|---|
| 4,814,605 | 3/1989 | Junkermann | 219/408 |
| 5,308,955 | 5/1994 | Watanabe | 219/390 |
| 5,332,557 | 7/1994 | Shahoda | 422/199 |
| 5,414,244 | 5/1995 | Imahashi | 219/497 |
| 5,509,967 | 4/1996 | Kypgpku et al. | 118/724 |
| 5,518,593 | 5/1996 | Hosokawa et al. | 204/192.12 |
| 5,520,742 | 5/1996 | Ohkase | 392/418 |
| 5,626,680 | 5/1997 | Porter et al. | 118/725 |
| 5,636,320 | 6/1997 | Yu | 219/390 |

FOREIGN PATENT DOCUMENTS

| | | |
|---|---|---|
| 63-227014 | 9/1988 | Japan . |
| 64-4018 | 1/1989 | Japan . |
| 5-152225 | 6/1993 | Japan . |

*Primary Examiner*—Philip H. Leung
*Assistant Examiner*—Shawntina Fuqua
*Attorney, Agent, or Firm*—Finnegan, Henderson, Farabow, Garrett & Dunner, L.L.P.

[57] ABSTRACT

A thermal processing apparatus having a substrate holding unit for mounting a substrate, a housing for constituting a processing chamber to house the substrate mounted on the substrate holding unit, a heat source arranged around the housing, and a shielding means arranged between the heat source and an end of the substrate, the shielding means serving to shield heat radiation radiated into the end of the substrate.

24 Claims, 8 Drawing Sheets

THERMAL PROCESSING APPARATUS WITH
A SHIELD BETWEEN HEATER AND
SUBSTRATE

BACKGROUND OF THE INVENTION

1. Field of the Invention

The present invention relates to a shielding unit arranged between an end of a substrate and a heat source, when the substrate such as a semiconductor substrate is subjected to a thermal processing. and the present invention relates to a thermal processing apparatus, and a thermal processing method of the same. The present invention relates more particularly to a thermal processing apparatus and a thermal processing method, in which the thermal processing is conducted with a high rising rate of the temperature of the substrate until it reaches to a desired value and excellent uniformity of temperature in a surface of the substrate can be achieved.

2. Description of the Related Art

A thermal processing technology for a semiconductor substrate such as Si and GaAs, and a glass substrate is inevitable on manufacturing of micro electronic devices such as DRAMs, SRAMs. EEPROMs and CCDs and panel display devices such as TFTs formed on glass.

For a thermal processing apparatus employed in such thermal processing, there are two systems: one is a sheet processing system for processing a sheet of a substrate, and the other is a batch system for processing a plurality of substrates simultaneously.

In both systems, it is inevitable to increase a rising rate or temperature per unit time until temperature in the thermal processing apparatus is raised to desired thermal processing temperature, namely, a lamp rate. A temperature distribution in a surface of the substrate to be treated should be uniform.

Since a total processing time for thermal processing can be shortened by virtue of a high lamp rate, a time required to manufacture semiconductor devices will be shortened.

Furthermore, in order to achieve a high integration of the semiconductor devices, a junction depth within the semiconductor devices must be small. Here, the magnitude of the junction depth is determined not only by a thermal processing time at desired temperature but also by the difference between heating values given to the substrate and that released from the substrate for a certain period of time. This certain period of time is from a time until the substrate rises to this desired temperature to a time until the substrate is cooled after thermal processing. In general, the higher the lamp rate, namely, the shorter a time until temperature rises to a desired value, the less the heating value given to the substrate. Therefore, the junction depth within the semiconductor device becomes shallower. In other words, it will be possible to form a shallower junction by increasing the lamp rate.

Furthermore, it is possible to achieve uniformity of characteristics of elements formed in the semiconductor substrate by making a temperature distribution in the substrate uniform, whereby a yield in manufacturing increases.

Furthermore, defects, for example, such as a slippage and a warp are caused by the temperature distribution in the substrate during the thermal processing. Therefore, it is possible to prevent the occurrence of the defects by making the temperature distribution in the substrate uniform, whereby a high yield in manufacturing the semiconductor devices and an improvement of characteristics of the semiconductor devices are achieved.

To achieve the uniformity of the characteristics among the element and to prevent the occurrence of the defects in the substrate, it is important to make the temperature distribution in the surface of the substrate uniform, not only for a period of time of the thermal processing at the desired temperature but also for both periods of time of increasing the temperature of the substrate and decreasing the temperature of the substrate.

Figure 7A:
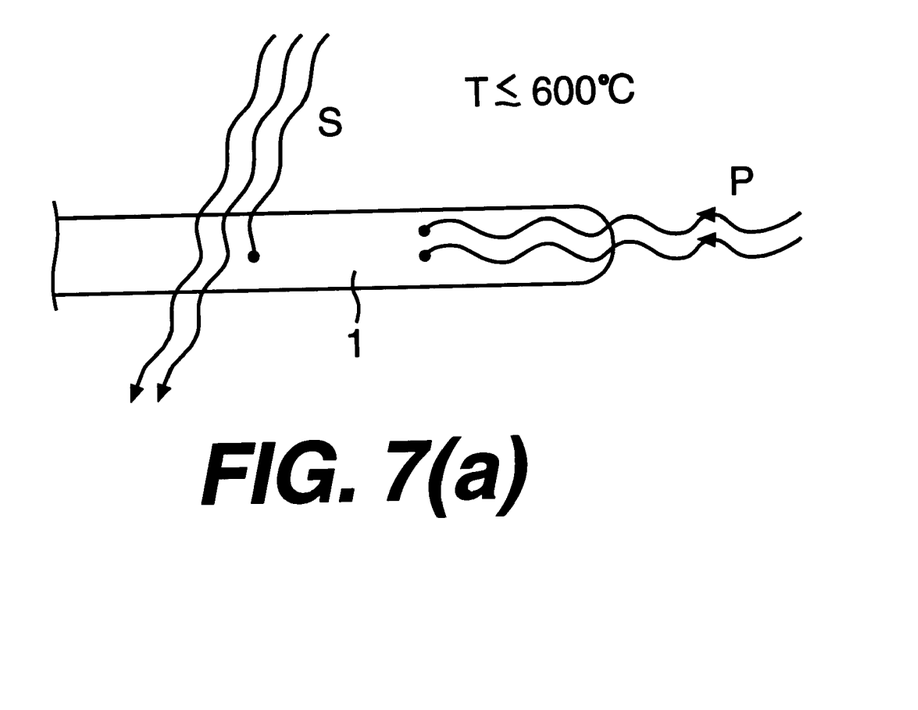
FIGS. 7(a) and 7(b) are schematic views showing a principle of a conventional thermal processing.
Figure 7B:
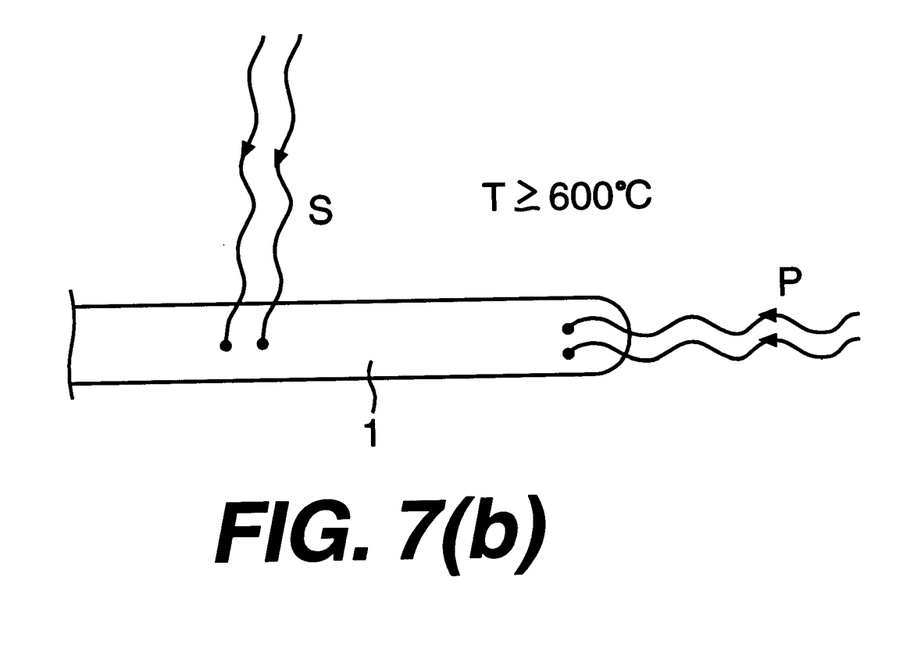

However, the increase in the uniformity of the temperature distribution of the substrate is generally contrary to the increase in the lamp rate. Namely, it becomes difficult to achieve uniformity in the temperature distribution in the substrate as the lamp rate increases. The reason for this fact will be described with reference to FIGS. 7($a$) and 7($b$). FIGS. 7($a$) and 7($b$) show an apparatus in which heat is radiated into a substrate 1 such as Si. Referring to FIGS. 7($a$) and 7($b$), the heat radiated into a surface of the substrate 1 is denoted as a symbol s, and the heat radiated perpendicularly into an end of the substrate 1 is denoted as a symbol p.

Particularly, while the temperature of the semiconductor substrate is low (see FIG. 7($a$)), the substrate behaves as a transmissible body for the heat radiation, whereby the substrate will hardly absorb the heat. In a crystalline Si substrate of a low impurity concentration of about $1\times10^{15}$ cm$^{-3}$, when the temperature is below 600° C., an absorption length for the heat radiation is, for example, about 10 mm.

Here, a thickness of the Si substrate is, for example, about 1 mm or less, and a diameter of the Si substrate is about several hundreds of millimeters. Specifically, as shown in FIG. 7($a$), sincu the absorption length for the heat radiation is longer in comparison with the thickness of the Si substrate, most of the heat S radiated into the surface of the substrate is not absorbed in the substrate, and it transmits through the substrate.

On the other hand, since the absorption length for the heat radiation is shorter in comparison with the diameter of the Si substrate, the heat P radiated into the end of the substrates approximately in perpendicular to the substrate, namely, in a parallel direction with the surface of the substrate, is absorbed in the substrate without transmitting through the substrate.

In the above-described manner, while the average temperatures of the substrate is in a low temperature range, the temperature in the end of the substrate increases at a higher rising rate in comparison with the center of the substrate. Therefore, the temperature in the end of the substrate becomes higher than that in the center of the substrate, whereby a large temperature difference is produced in the surface of the substrate.

When the average temperature of the substrate becomes high see FIG. 7($b$)), the substrate shows a non-transmissible property for a heat radiation. The absorption length of the substrate for the heat radiation becomes very small in comparison with the thickness of the substrate. Therefore, if the heat radiation into the substrate from a heater is uniform, the substrate is heated uniformly, whereby the temperature rising rate becomes uniform.

However, the temperature difference between the end of the substrate and the center thereof is produced at the low temperature range. Although such temperature distribution in the substrate is extinguished by thermal conduction, time is needed until the temperature distribution in the substrate changes to be uniform perfectly.

Particularly, during a rapid thermal processing, the time until the substrate is raised to the desired temperature of 1000° C. is, for example, only about 10 seconds. The time until the temperature of the substrate reaches the desired value after it has exceeded the low temperature range is not sufficient enough for the temperature difference to disappear by virtue of the thermal conduction, which was produced in the low temperature range.

For this reason, also in the range where the temperature of the substrate is high, the large temperature difference remains, so that there is a possibility of occurrence of slippages and the like.

The problem of the temperature difference in the surface of the substrate produced in the low temperature range during the above-described thermal processing is especially severe when the heat is radiated uniformly from both directions of the surface of the substrate and the end of the substrate. For example, in a hot wall type RTP (rapid thermal processing) apparatus employing a resistance heater there is a problem because a surface and an end of a substrate are radiated by heat with approximately equal intensity.

Figure 8:
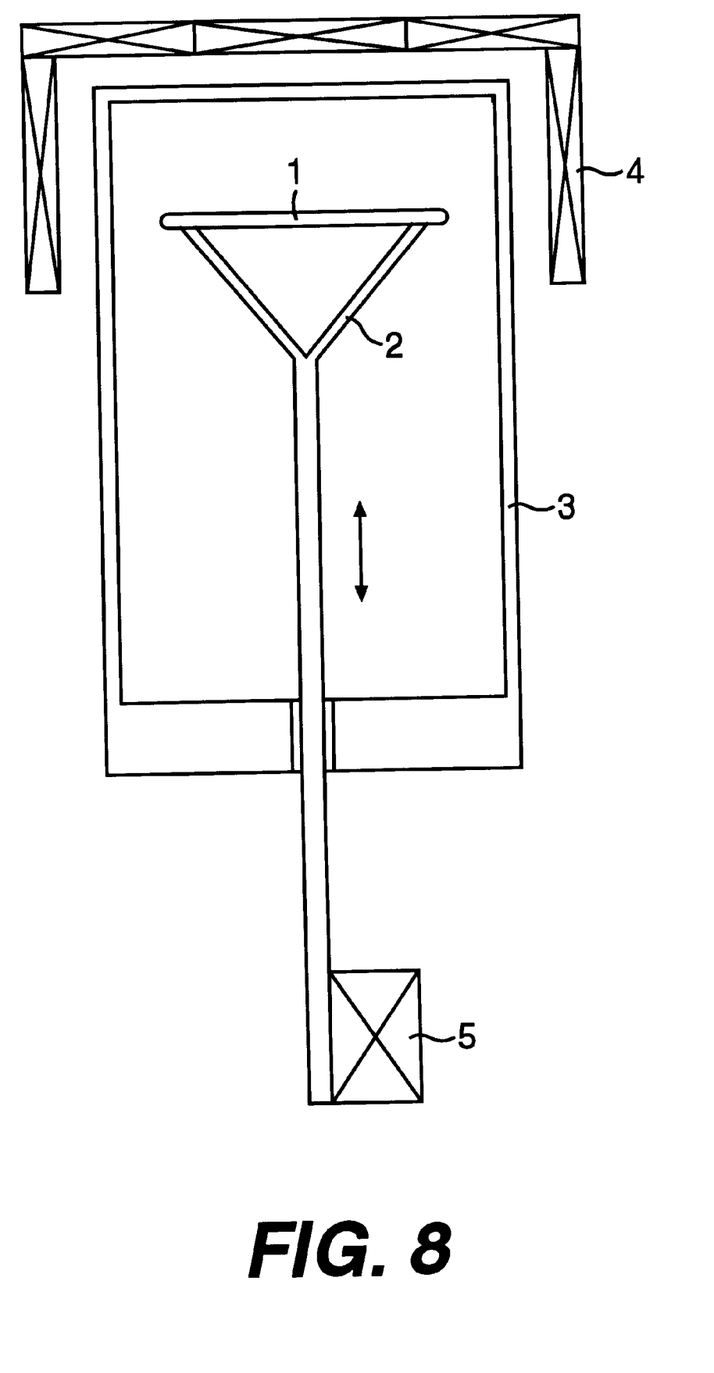
FIG. 8 is a sectional view showing a structure of a conventional thermal processing apparatus.

A structure of the conventional hot wall type RTP apparatus employing the resistance heater is illustrated in FIG. 8.

The conventional RTP apparatus comprises a substrate holding unit 2 for mounting a substrate 1; a housing 3 for constituting a processing chamber which houses the substrate 1 mounted on the substrate holding unit 2; a resistance heater 4 arranged around the housing 3; and a driving means 5 equipped to the substrate holding unit 2 to move upward and downward the substrate mounted on the substrate holding unit 2.

In the RTP apparatus having the above-described structure, the substrate 1 is mounted on the substrate holding unit 2, and the substrate holding unit 2 is, for example, moved upward by means of the driving means 5, whereby the substrate 1 is brought near the resistance heater 4. Thus, the temperature of the substrate 1 is raised quickly. Furthermore, by holding the substrate 1 close to the resistance heater 4, the temperature of the substrate 1 is kept constant. Furthermore, the substrate 1 is kept away from the resistance heater4 by moving the substrate holding unit 2, for example, downward by means of the driving means 5, whereby the temperature of the substrate 1 is cooled quickly.

The RTP apparatus employing the above described resistance heater has a structure such that the resistance heater 4 surrounds the substrate 1 during the thermal processing. Consequently, the RTP is able to perform the thermal processing for the substrate 1 utilizing thermal energy more effectively, in comparison with, for example, a thermal processing apparatus which heats a substrate using a lamp. In addition, the RTP apparatus has a feature in that the apparatus is able to keep the temperature of the substrate constant stably during the thermal processing.

However, as described above, since the RTP apparatus is constructed such that heat is radiated in the directions toward both the surface of the substrate 1 and the end thereof from the outside approximately uniformly, there is the problem that the temperature difference between the surface of the center and the end thereof exists due to the transmissible property of the substrate for the heat radiation while the temperature of the substrate is raised, especially during the low temperature range.

Furthermore, since the temperature of the substrate is raised rapidly until it reaches the desired temperature, there is a problem that the temperature difference occurred while the temperature of the substrate is in the low temperature range can not be perfectly lessened by the thermal conduction.

In order to solve these problems, a method is considered, wherein in course of raising the temperature of the substrate 1, a rise in the temperature of the substrate 1 is stopped at the temperature of the substrate 1, for example, at about 600 to 700° C., and the temperature of the substrate 1 is kept at this temperature until the temperature difference caused in the low temperature range is perfectly extinguished by the thermal conduction. However, when this method is employed, the time until the temperature of the substrate 1 reaches to the desired value is prolonged, whereby the total time for the thermal processing becomes long.

As described above, the conventional RTP apparatus employing the resistance heater involves inherently a problem of difficulty in increasing a rising rate of the temperature of the substrate as well as in shortening the processing time. In the conventional RTP, there is also a problem of difficulty in achieving uniformity of the temperature in the substrate uniform.

SUMMARY OF THE INVENTION

The object of the present invention is to provide a thermal processing apparatus and a thermal processing method which are able to achieve a high rising rate of temperature in a substrate, and are preserve temperature uniformity in a substrate. The present invention relates to a shielding unit arranged between an end of a substrate and a heat source, when the substrate such as a semiconductor substrates is subjected to a thermal processing, and the present invention relates to a thermal processing apparatus, and a thermal processing method of the same. The present invention relates more particularly to a thermal processing apparatus and a thermal processing method, in which the thermal processing is conducted with a high rising rate of the temperature of the substrate until it reaches to a desired value and excellent uniformity of temperature in a surface of the substrate can be achieved.

To solve the above-described problems and to achieve the objects. a first aspect of a thermal processing apparatus of the present invention comprises a substrate holding unit for holding a substrate having an edge portion during thermal processing and a heater arranged to heat the substrate and a shield between the heater and the substrate, the shield being arranged to shield heat from the heater from reaching the edge portion of the substrate.

In the first aspect of the thermal processing apparatus, the shield comprises a first portion and second portion, the first portion having a high absorptivity and the second portion having a low absorptivity.

In the first aspect of the thermal processing apparatus, the shield comprises a first portion and second portion, the first portion having a high absorptivity and the second portion having a low absorptivity, wherein the first portion faces the edge of the substrate and the second portion faces the heater.

In the first aspect of the thermal processing apparatus, the shield comprises a first portion and second portion, the first portion having a high absorptivity and the second portion having a low absorptivity wherein the second portion faces the edge of the substrates and the first portion faces the heater.

In the first aspect of the thermal processing apparatus, the shield comprises a first portion and a second portion, the first portion having a high relative heat transmission property and the second portion having a low relative heat transmission property.

In the first aspect of the thermal processing apparatus the shield comprises a first portion and a second portion, the first portion having a high relative heat transmission property and the second portion having a low relative heat transmission property wherein the first portion faces the edge of the substrate and the second portion faces the heater.

In the first aspect of the thermal processing apparatus, the shield comprises a first portion and a second portion, the first portion having a high relative heat transmission property and the second portion having a low relative heat transmission property wherein the second portion faces the edge of the substrate and the first portion faces the heater.

In the first aspect of the thermal processing apparatus, the shield comprises a first portion and second portion, the first portion having a high absorptivity and the second portion having a low absorptivity wherein the first portion comprises quartz or bubbled quartz, and the second portion comprises SiC.

In the first aspect of the thermal processing apparatus, the shield is an annular body.

A second aspect of a thermal processing apparatus of the present invention comprises a substrate holding unit for holding a substrate having an edge portion during thermal processing and a heater arranged to heat the substrate and a heat shield and means for moving the shield between a first portion and a second position, the first position being between the edge of the substrate and the heater and the second position not being between the substrate and the heater.

In the second aspect of the thermal processing apparatus. further comprising a housing containing the substrate holding unit and the heater being outside of the housing.

In the second aspect of the thermal processing apparatus, further comprising a housing containing the substrate holding unit and the heater being outside of the housing wherein the shield is inside of the housing.

In the second aspect of the thermal processing apparatus, further comprising a housing containing the substrate holding unit and the heater being outside of the housing wherein the shield is outside of the housing.

In the second aspect of the thermal processing apparatus, further comprising means for moving the substrate holding unit between a first position and a second position and the first position being relatively near the heater and the second position being relatively away from the heater.

In the second aspect of the thermal processing apparatus, further comprising means for moving the substrate holding unit between a first position and a second position and the first position being relatively near the heater and the second position being relatively away from the heater wherein the means for moving the substrate holding unit and the means for moving the shield are arranged to move the substrate holding unit and the shield independently.

In the second aspect of the thermal processing apparatus, wherein the shield comprises a first portion and a second portion, the first portion having a high absorptivity and the second portion having a low absorptivity.

In the second aspect of the thermal processing apparatus, wherein the shield comprises a first portion and a second portion the first portion having a high absorptivity and the second portion having a low absorptivity and the first portion faces the edge of the substrate and the second portion faces the heater.

In the second aspect of the thermal processing apparatus, wherein the shield comprises a first portion and a second portion, the first portion having a high absorptivity and the second portion having a low absorptivity and the second portion faces the edge of the substrate and the first portion faces the heater.

In the second aspect of the thermal processing apparatus, wherein the shield comprises a first portion and a second portion the first portion having a high relative heat transmission property and the second portion having a low relative heat transmission property.

In the second aspect of the thermal processing apparatus, wherein the shield comprises a first portion and a second portion, the first portion having a high relative heat transmission property and the second portion having a low relative heat transmission property, and the first portion faces the edge of the substrate and the second portion faces the heater.

In the second aspect of the thermal processing apparatus, wherein the shield comprises a first portion and a second portion, the first portion having a high relative heat transmission property and the second portion having a low relative heat transmission property, and the second portion faces the edge of the substrate and the first portion faces the heater.

In the second aspect of the thermal processing apparatus, wherein the shield comprises a first portion and a second portion, the first portion having a high relative heat transmission property, and the second portion having a low relative heat transmission property, and the first portion comprises quartz or bubbled quartz, and wherein the second portion comprises SiC.

In the second aspect of the thermal processing apparatus, wherein the shield is an annular body.

In a thermal processing method using the first aspect of the thermal processing apparatus and the second aspect of the thermal processing apparatus, the thermal processing method comprising the steps of moving a substrate housing an edge portion close to a heat source, and moving a shield close to the heat source between the heat source and an edge of the substrate, and initially heating the substrate with the heater while the shield is between the edge of the substrate and the heater, and moving the shield away from the heater after initially heating the substrate and, heating the substrate with the heater while the shield is not between the edge of the substrate and the heater.

In the thermal processing method, the step of moving the substrate close to the heat source and the step of moving the shield close to the heat source occur simultaneously.

BRIEF DESCRIPTION OF THE DRAWINGS

For a more complete understanding of the present invention and the advantages thereof, reference is now made to the following description taken in conjunction with the accompanying drawings, in which;

FIGS. 5(*a*), 5(*b*), and 5(*c*) are schematic views showing embodiments of a shielding unit in a thermal processing apparatus of the present invention;

DETAILED DESCRIPTION OF THE PREFERRED EMBODIMENTS

As described above, the thermal processing apparatus of the present invention comprises a shielding means arranged between a heat source and an end of a substrate, said shielding means shielding a heat radiation radiated into the end of the substrate, whereby radiation of heat into the end of the substrate can be prevented by the shielding means.

As described above, an absorption length of the heat radiation is larger than a thickness of the substrate and smaller than a diameter of the substrate particularly in a low temperature range. Therefore, the heat radiation, which is radiated from the end of the substrate and progresses in a diameter direction of the substrate, is absorbed in the substrate, whereby the substrate is heated. On the other hand, the heat radiation radiated in a perpendicular direction to the surface of the substrate passes through the substrate, whereby the surface of the substrate is not heated. Owing to this fact, in the conventional thermal processing apparatus wherein the surface of the substrate and the side of the substrate are uniformly radiated by the heat radiation, only the end of the substrate is heated particularly in the low temperature range. Therefore, the temperature difference between the end of the substrate and the center thereof is large so that there is a possibility of occurrence of slippages and like.

On the contrary, in the thermal processing apparatus of the present invention, radiation of heat into the end of the substrate can be prevented by its shielding means. Therefore, it is possible to prevent the end of the substrate from being heated. The temperature difference between the end of the substrate and the center thereof can be reduced, thereby enhancing uniformity of the temperature in the substrate.

Furthermore, since the temperature difference between the end of the substrate and the center thereof is small before the temperature of the substrate is raised to the high temperature range, there is no necessity to keep the temperature of the substrate at a certain value until the temperature difference is extinguished by thermal conduction. Therefore, it is possible to raise the temperature of the substrate to a desired value speedily, whereby total processing time can be shortened.

Particularly, in the thermal processing apparatus of the present invention wherein the shielding unit consists of the first shielding unit portion having a low emissivity and a low absorptivity and a second shielding unit portion having a high emissivity and a high absorptivity, the first shielding unit portion being arranged so as to face the end of the substrate and the second shielding unit portion being arranged outside the first shielding unit portion, since the second shielding unit portion has the high absorptivity for the heat radiation, the heat radiation is absorbed by the second shielding unit portion, whereby it is possible to prevent the end of the substrate from being heated. Furthermore, since the first shielding unit portion has the low absorptivity, the heat radiation is reflected by the first shielding unit portion, whereby the heat radiation emitted from the substrate can be radiated into the substrate again. Therefore, the substrate can be heated effectively utilizing the heat radiation. Thus, processing time for the thermal processing can be reduced.

In the thermal processing apparatus of the present invention wherein the shielding unit is composed of a first shielding unit portion arranged so as to face the end of the substrate and a second shielding unit portion arranged outside the first shielding unit portion, the first shielding unit portion having a transmissible property for the heat radiation and the first shielding unit portion having a non-transmissible property, since the second shielding unit portion has the non-transmissible property for the heat radiation, the heat radiation is absorbed by the second shielding unit portion whereby it is possible to prevent the end of the substrate from being heated. Furthermore, since the first shielding unit portion has the transmissible property for the heat radiation, the heat radiation passes through the first shielding unit portion. Here, by adjusting a heat capacity of the first shielding unit portion, the temperature of the first shielding unit portion and the temperature of the center of the substrate can be raised with the same rising rate. As described above, the temperature of the first shielding unit portion facing the end of the substrate is raised as the temperature of the center of the substrate is raised, whereby the temperature difference between the end of the substrate and the center thereof can be reduced.

Furthermore, in the thermal processing apparatus of the present invention which comprises the shielding unit holding means and the driving means, the improvement wherein the shielding means is moved between first and second positions by the driving means, the shielding means shielding the heat radiation radiated into the end of the substrate at the first position and shielding no heat radiation radiated into the substrate as the second position; by moving, in the low temperature range, the shielding means to the first position where the shielding means shields the heat radiation radiated into the end of the substrate, heating of only the end of the substrate can be prevented, whereby the occurrence of the temperature difference between the end of the substrate and the center thereof can be prevented.

Furthermore, since the substrate has the non-transmissible property for the heat radiation and since both of the heat radiation radiating from the surface direction of the substrate and the heat radiation from the end direction of the substrate heat the substrate, by moving the shielding means to the second position where the heat radiation is not shielded, it is possible to heat the substrate uniformly. As described above, in the thermal processing apparatus of the present invention, by shielding the end of the substrate from the heat radiation by means of the shielding means in the temperature range where the substrate exhibits the transmissible property, it will be possible to achieve the uniformity of the temperature of the substrate. Furthermore, in the temperature range where the substrate exhibits the non-transmissible property, the shielding means is moved in order that the heat radiation reaching to the substrate is not shielded whereby it is possible to heat the substrate uniformly.

Furthermore, in this case, since the shielding means can be removed during the thermal processing performed at the desired temperature, the thermal processing can be performed using thermal energy effectively.

Furthermore, when processing such as formation of a thin film, for example, an oxide film, is performed filling the inside of the housing with suitable gas, the shielding means is removed, whereby lack of uniformity of supply of the gas to the surface of the substrate due to the presence of the shielding means can be prevented.

In the thermal processing apparatus of the present invention wherein the shielding means is made of an annular shielding body arranged outside the end of the substrate, the heat radiation radiated into the end of the substrate in a parallel direction with the surface of the substrate can be shielded effectively.

In the thermal processing apparatus of the present invention wherein the shielding means is arranged outside the housing, the thermal processing apparatus can be realized easily by improving simply the conventional thermal processing apparatus.

Since the shielding means is arranged outside the housing, freedom of choice of materials for the shielding means can be increased in comparison with the case where the shielding means is arranged inside the housing. Hence, the thermal processing apparatus of the present invention can be realized more easily. Embodiments of the present invention will be described with reference to the accompanying drawings FIG. 1 is a sectional view showing a structure of a thermal processing apparatus of a first embodiment of the present invention.

The thermal processing apparatus of the first embodiment of the present invention, like the conventional processing apparatus, comprises a substrate holding unit 2; housing 3 which constitutes a processing chamber for housing a substrate 1 mounted on the substrate holding unit 2; a resistance heater 4 disposed around the housing 3; and a driving means 5 which is equipped to the substrate holding unit 2 in order to move upward and downward the substrate 1 mounted on the substrate holding unit 2.

Figure 1:
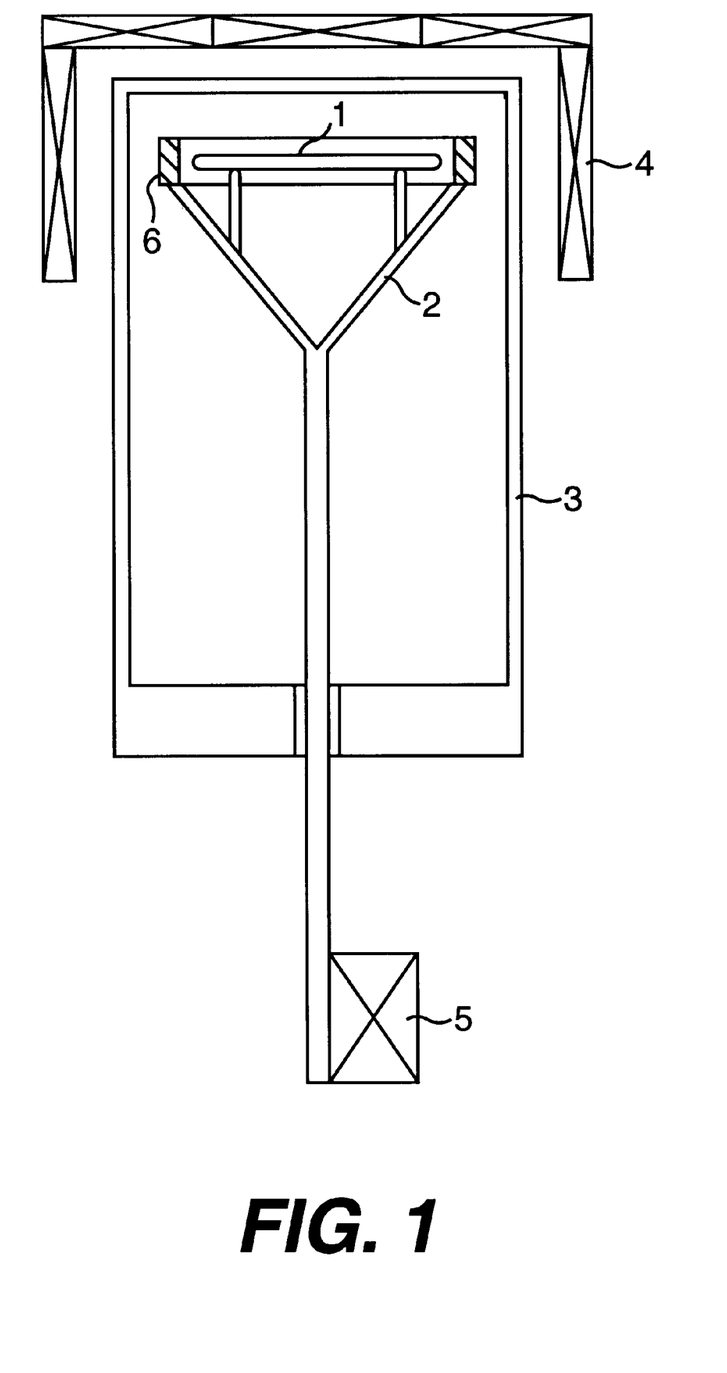
FIG. 1 is a sectional view showing a structure of a thermal processing apparatus of a first embodiment of the present invention.

In the thermal processing apparatus shown in FIG. 1, like the conventional apparatus, the substrate 1 is mounted on the substrate holding unit 2, and the substrate holding unit 2 is moved, for example, upward by the driving means 5, whereby the substrate 1 is placed close to the resistance heater 4. Thus, the temperature of the substrate 1 is raised quickly. Furthermore, the substrate 1 is kept close to the resistance heater 4, whereby the substrate 1 is kept at a constant temperature. Then, the substrate holding unit 2 is moved, for example, downward by the driving means 5, whereby the substrate 1 is moved away from the resistance heater 4. Thus, the temperature of the substrate 1 is dropped speedily.

Furthermore, in the thermal processing apparatus of the first embodiment, unlike the conventional thermal processing apparatus, the shielding unit 6 is arranged so as to surround the substrate 1. In this embodiment, the shielding unit 6 is equipped to the substrate holding unit 2. In addition, the shielding unit 6 should be made of a material having a heat absorption property, and, for example, quartz and SiC may be employed as the shielding unit 6. An inner diameter of the circular shielding unit 6 is set larger by e.g., about 1 to 2 mm than the other-diameter of the substrate 1. An outer diameter of the shielding unit 6 is set larger by e.g., about 10 to 20 mm than its inner diameter. A height of the shielding unit 6 is set e.g., about 5 to 10 mm.

Figure 2:
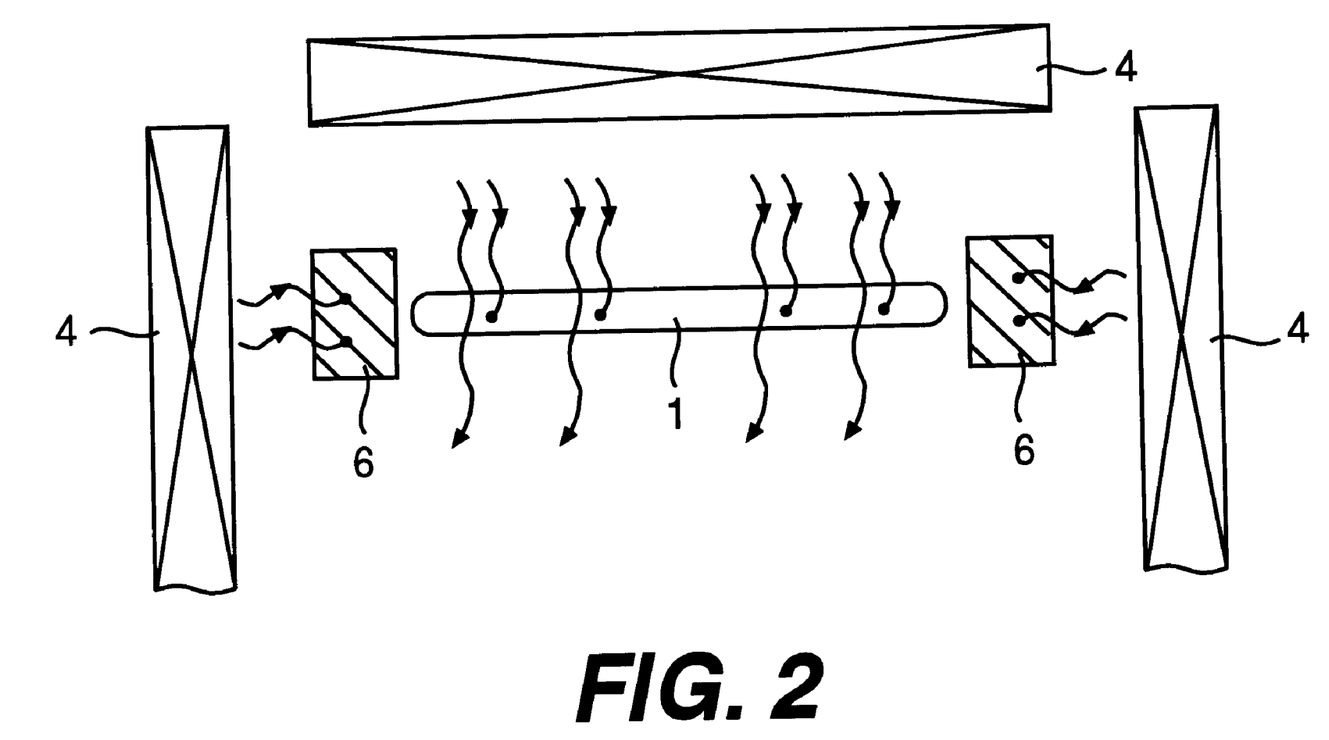
FIG. 2 is a schematic view showing a principle of a thermal processing according to the present invention.

As described above, the thermal processing apparatus of this embodiment has a feature in that the circular shielding unit 6 is arranged between the substrate 1 and the heater 4. As shown in FIG. 2, since the shielding unit 6 absorbs radiation beat from the heater 4, the radiation heat to be directly supplied perpendicularly to the end of the substrate 1 can be removed. In such manner, particularly in the low temperature range, local heating of the end of the substrate 1 can be prevented, and an increase in the temperature difference between the end of the substrate 1 and the surface thereof can be suppressed.

Figure 3:
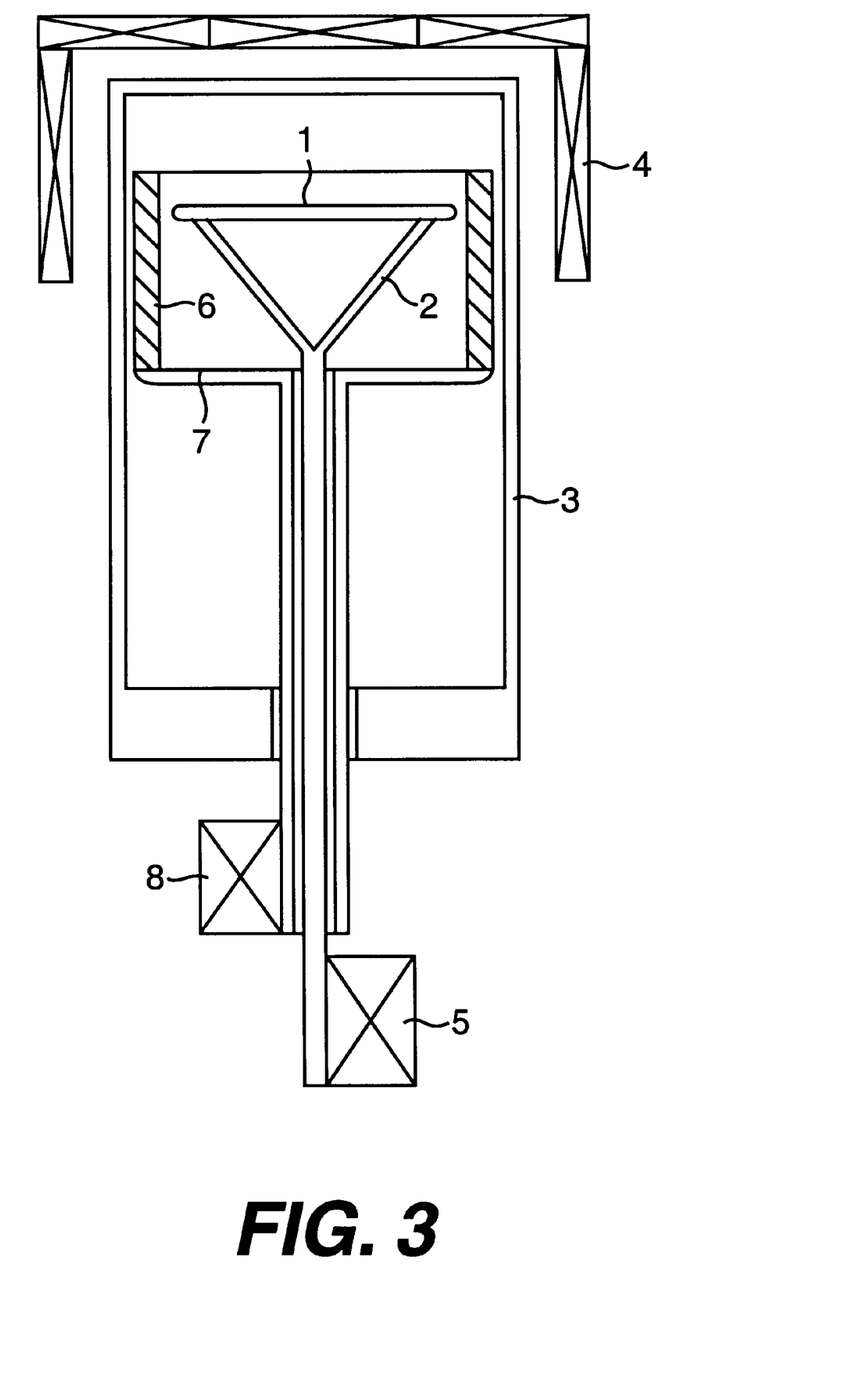
FIG. 3 is a sectional view showing a structure of a thermal processing apparatus of a second embodiment of the present invention.

Next, a thermal processing apparatus of a second embodiment of the present invention will be described with reference to FIG. 3. FIG. 3 is a sectional view showing a structure of the thermal processing apparatus of the second embodiment of the present invention.

The thermal processing apparatus of this embodiment, like the thermal processing apparatus of the first embodiment, comprises a substrate holding unit 2 for mounting a substrate 1; a housing 3 which constitutes a processing chamber for housing the substrate 1 mounted on the substrate holding unit 2; a resistance heater 4 arranged around the housing 3; a driving means 5 equipped to the substrate holding unit 2 in order to move upward and downward the substrate 1 mounted on the substrate holding unit 2; and a shielding unit 6 surrounding annularly the substrate 1.

With the above-described structure, in the thermal processing apparatus of this embodiment, like the thermal processing apparatus of the first embodiment, the shielding unit 6 surrounding annularly the substrate 1 absorbs radiation heat, whereby local heating of the end of the substrate 1 can be prevented, particularly in the low temperature range.

Unlike the thermal processing apparatus of the first embodiment wherein the shielding unit 6 is equipped to the substrate holding unit 2, in the thermal processing apparatus of this embodiment, the shielding unit 6 is equipped to a shielding unit holding body 7. Another driving means 8 different from the driving means 5 is equipped to the shielding unit holding body 7.

With the above-described structure, in the thermal processing apparatus, the shielding unit 6 equipped to the shielding unit holding body 7 is able to move upward and downward by the driving means 8 equipped to the shielding unit holding body 7. The shielding unit 6 moves independently from the substrate 1.

As described above, the substrate 1 has a transmissible property for the heat radiation only in the low temperature range and has a non-transmissible property in the high temperature range. Specifically, the thermal difference between the end of the substrate 1 and the surface thereof is produced only in the low temperature range. In the high temperature range, both of the end of the substrate 1 and the surface thereof are heated equally.

It should be noted that by constituting the thermal processing apparatus such that the substrate 1 and the shielding unit 6 are able to move independently from each other as in this embodiment, the circumference of the substrate 1 can be surrounded by the shielding unit 6 in the low temperature range and the shielding unit 6 can he removed from the circumference of the substrate 1 in the high temperature range.

For example, the substrate 1 is made close to the heater 4 by the driving means 5, and, at the same, the shielding unit 6 is made also close to the heater 4 by the driving means 8. Subsequently, after the substrate 1 and the shielding unit 6 reach the desired positions and, moreover, the temperature of the substrate 1 becomes a desired value, only the shielding unit 6 is moved away from the heater 4 by the driving means 8. Thus, in the situation that only the substrate 1 is covered with the heater 4, the thermal processing at the desired temperature is performed.

Therefore, in the high temperature range, heat is radiated into the surface of the substrate 1 and the end thereof uniformly, whereby it is possible to enhance further the degree of uniformity of the temperature in the substrate 1.

Furthermore, since no heat is absorbed by the shielding unit 6 during the thermal processing at the desired temperature, the thermal processing for the substrate 1 can be performed using heat energy effectively.

Furthermore, when the thermal processing apparatus is used to form a thin film such as an oxide film on the substrate 1 in a state where the housing 3 is filled up with, for example, oxide gas, the oxide gas will not be supplied uniformly to the surface of the substrate 1 because of the presence of the shielding unit 6. Therefore, there is a possibility of unevenness of a film thickness of the oxide film to be formed. However, in the thermal processing apparatus of this embodiment, the shielding unit 6 can be removed during the thermal processing at the desired temperature, whereby the possibility of the unevenness of the film thickness of the film can be removed.

Figure 4:
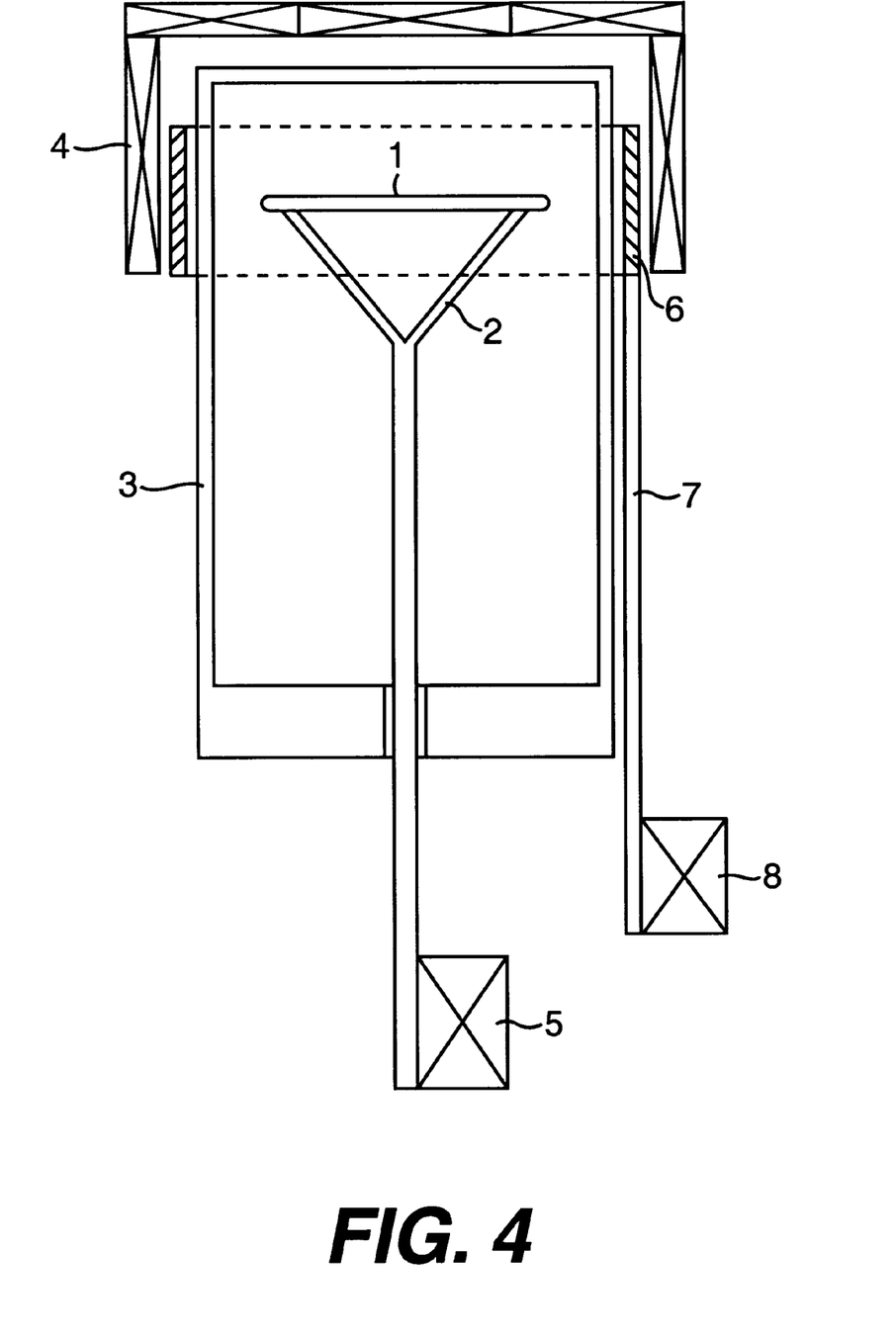
FIG. 4 is a sectional view showing a structure of a thermal processing apparatus of a third embodiment of the present invention.

Next, a thermal processing apparatus of a third embodiment of the present invention will be described with reference to FIG. 4. FIG. 4 is a sectional view showing a structure of the thermal processing apparatus of the third embodiment of the present invention.

The thermal processing apparatus of the third embodiment has a structure that is approximately the same as that of the second embodiment. However, the structure of the thermal processing apparatus of the third embodiment differs from that of the second embodiment in that the shielding unit 6 is not arranged inside the housing 3 but outside the housing 3.

With such structure, the thermal processing apparatus of the third embodiment exhibits an effect of simplicity in constituting the apparatus in addition to the effect of the foregoing second embodiment. The thermal processing apparatus of the third embodiment can be constituted by arranging the shielding unit 6, the shielding unit body 7, and the driving means 8, outside the housing 3 of the conventional thermal processing apparatus. Therefore, the thermal processing apparatus of the third embodiment can be easily realized because modification of the housing 3 is not needed and consideration about airtightness of the housing 3 is not needed, in comparison with the case where the shielding unit 6 is arranged inside the housing 3, whereby the thermal processing apparatus can be realized simply.

Furthermore, since the shielding unit 6 is arranged outside the housing 3, freedom in choosing materials that are allowed to use for the shielding unit 6 can be increased.

Figure 5A:
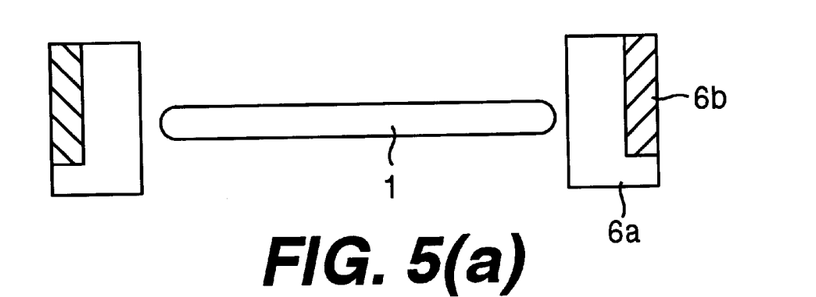
Figure 5B:
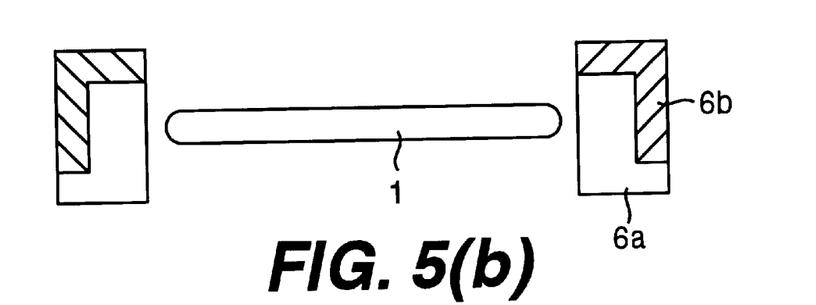
Figure 5C:
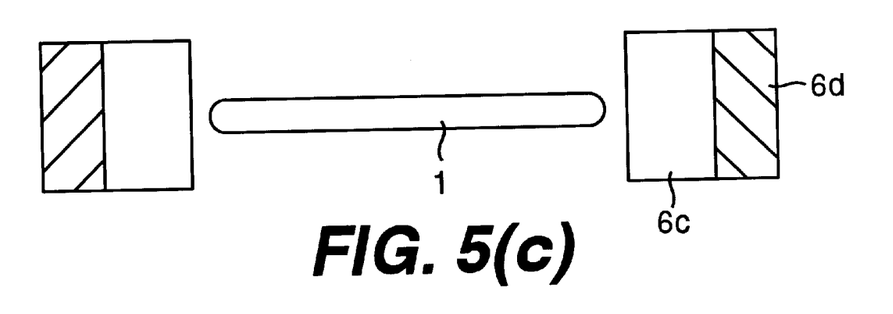

Next, various kinds of structures of the shielding unit 6 will be described with reference to FIGS. 5(*a*), 5(*b*), and 5(*c*). FIGS. 5(*a*). 5(*b*), and 5(*c*) are sectional views showing embodiments of the structures of the shielding unit 6. In these figures, the substrate holding unit 2 and the housing 3 and the like are omitted.

As shown in the foregoing first to fourth embodiments, the shielding unit 6 can be constituted by a single material. Furthermore, the shielding unit 6 can be constituted by combining a plurality of materials as shown in FIGS. 5(*a*), 5(*b*), and 5(*c*). Specifically, it is possible to apply various kinds of structures of the shielding unit 6 in embodiments described later to the foregoing embodiments.

The shielding unit 6 shown in FIGS. 5(*a*) and 5(*b*) consists of shielding unit portions 6*a* and 6*b*. The shielding unit portion 6*a* is constituted by a material which has a comparatively low emissivity, a low thermal conductivity, and a large thermal capacity, such as quartz or bubbled quartz. The shielding unit portion 6*a* is disposed so as to face the substrate 1. The shielding unit portion 6*b* is constituted by a material of a comparatively high thermal emissivity, such as SiC, and is disposed between the shielding unit portion 6*a* and the heater 4 (not shown).

In the shielding unit of a first embodiment shown in FIG. 5(*a*), the shielding unit portion 6*b* is formed only on the part of the side surface of the shielding unit 6. The width of the shielding unit portion 6*b* shall be, for example, about 0.3 to 2 mm. Furthermore, the height of the shielding unit portion 6*b* shall be smaller by, for example, 1 to 2 mm in comparison with that of the shielding unit portion 6*a*.

Next, in the shielding unit 6 of a second embodiment shown in FIG. 5(*b*), the shielding unit portion 6*b* is formed not only on the part of the side surface of the shielding unit 6 but also on the upper surface of the shielding unit 6. The thickness of the shielding unit portion 6*b* shall be, for example, about 0.3 to 2 mm. The part of the shielding unit portion 6*b* formed on the upper surface of the shielding unit 6 has the same width as that of the shielding unit 6.

As described above, in the foregoing first and second embodiments, the shielding unit portion 6*b* having the high emissivity is arranged between the substrate 1 and the heater 4, and the shielding unit portion 6*a* having the low emissivity, the low thermal conductivity, and the large thermal capacity is arranged between the shielding unit portion 6*b* and the substrate 1 in order that the shielding unit portion 6*a* faces the substrate 1.

In general, a material of a high emissivity has a high thermal absorptivity. Therefore, the shielding unit portion 6*b* having a high emissivity, namely, a high thermal absorptivity, is arranged between the substrate 1 and the heater 4, whereby the shielding unit portion 6*b* absorbs the heat radiation from the heater 4. Thus, the temperature of the shielding unit portion 6*b* is raised faster than that of the substrate 1. Therefore, the heat radiation from the heater 4 is perfectly shielded, whereby it is possible to prevent the temperature of the end of the substrate 1 from being reduced.

Furthermore, the shielding unit portion 6*a* is arranged inside the shielding unit portion 6*b* in order that the shielding unit portion 6*a* faces the substrate 1. Since the shielding unit portion 6*a* has a high emissivity, specifically, the shielding unit portion 6*a* has a low absoptivity, and a high reflectivity, by reflecting the heat radiation radiated from the substrate 1, it is possible to heat the substrate 1 again. Thus, the end of the substrate 1 is insulated thermally from other portions of the substrate 1 so that uniformity of the temperature in the surface of the substrate 1 is enhanced.

Furthermore, although the shielding unit portion 6*b* absorbs the heat radiation so that the temperature of the shielding unit portion 6*b* is raised faster than that of the substrate 1, it is possible to prevent, by setting the thermal conductivity of the shielding unit portion 6*b* low, the end of the substrate 1 from being heated due to the thermal conduction from the heated shielding unit portion 6*b*. This is also the way to insulate thermally the end of the substrate 1 from other portions.

In certain circumstances, the shielding unit portion 6*a* is provided with a large thermal capacity, whereby an increase in temperature of the shielding unit portion 6*a* due to the high temperature shielding unit portion 6*b* can be suppressed. Therefore, it is possible to prevent the end of the substrate 1 from being heated by the high temperature shielding unit portion 6*a*.

Furthermore, the second embodiment shown in FIG. 5(*b*) as shown in FIG. 1, shows the case where the heater 4 is arranged so as to cover the side and upper surfaces of the substrate 1. Specifically, in the thermal processing apparatus as shown in FIG. 1, wherein the heater is arranged also over the substrate 1, the end of the substrate 1 is heated not only by the heat radiation from the side direction but also by the heat radiation from the above direction. Therefore, as in the second embodiment, by constituting the upper surface of the shielding unit 6 as the shielding unit portion 6b having a high emissivity, it is possible to prevent that the heat radiation from the above direction reaches the end of the substrate 1. Thus, uniformity of the temperature distribution in the substrate 1 will be further enhanced in comparison with the first embodiment.

As described above, in the second embodiment wherein the shielding unit portion 6a is arranged inside the shielding unit portion 6b of a high emissivity, the shielding unit portion 6a having a low emissivity, a low thermal conductivity, and a large thermal capacity, it is possible to utilize thermal energy effectively, and it is also possible to prevent the end of the substrate 1 from being heated due to the shielding unit 6, in comparison with the case where the shielding unit 6 is made of a single material. Thus, the end of the substrate 1 is insulated thermally so that uniformity of the temperature in the substrate 1 can be enhanced.

Next, another structure of the shielding unit 6 will be described with reference to FIG. 5(c) as a third embodiment.

Like the foregoing second and third embodiments, a shielding unit 6 of this embodiment also consists of two shielding unit portions 6c and 6d, and properties of the shielding unit portions 6c and 6d are different from those of the foregoing first and second embodiments.

In this embodiment, the shielding unit portion 6d is made of a material which has a non-transmissible property for the heat radiation. That is, the shielding unit portion 6d does not transmit the heat radiation. Thus, the amount of heat reaching to the end of the substrate 1 is adjusted.

Furthermore, the shielding unit portion 6c is made of a material which has the transmissible property for the heat radiation, for example, quartz, and the thermal capacity of the shielding unit portion 6c is adjusted in order that the temperature of the shielding unit portion 6c is raised almost like the center of the substrate 1. For example, a choice of a thickness of the shielding unit portion 6c and a design of a shape of the shielding unit portion 6c can be performed suitably as occasion demands. With such structure, it is possible to make the temperature rising rate of the end of the substrate 1 equal to that of the center of the substrate 1. Therefore, the occurrence of the temperature difference in the surface of the substrate 1 is suppressed during the temperature of the substrate 1 is being increased, thereby preventing the occurrence of the slippage and the like.

Figure 6:
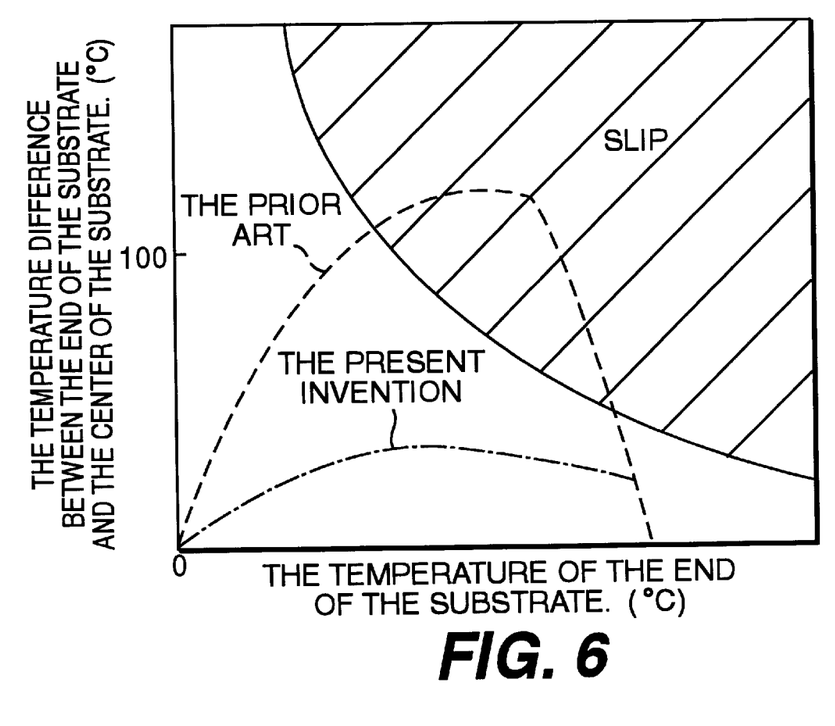
FIG. 6 is a graphical representation showing effects of the present invention.

FIG. 6 is a graphical representation showing effects of the thermal processing apparatus of the present invention. In FIG. 6, the comparison results of the uniformity of temperature in the substrate are shown in the case where both of the thermal processing apparatus and the present invention and the conventional processing apparatus are used.

In FIG. 6, the axis of abscissas indicates the temperature of the end of the substrate, and the axis of ordinates indicates the temperature difference between the end of the substrate and the center of the substrate. The region illustrated with the slant lines in FIG. 6 indicates a temperature range where slippages are apt to occur owing to the temperature difference between the end of the substrate and the center thereof. The larger the temperature difference between the end of the substrate and the center thereof and the higher the temperature of the end of the substrate, the more likely the occurrence of the slippages.

As shown in FIG. 6, in the low temperature range where the temperature of the substrate is e.g., 600° C. or less, the temperature difference between the end of the substrate and the center thereof is large in the past, and there is a possibility that the slippages may occur. On the other hand, in the thermal apparatus of the present invention, the temperature difference between the end of the substrate and the center thereof can be reduced in the low temperature range whereby it is possible to prevent the occurrence of the slippages.

In the descriptions for the foregoing embodiments, the hot wall type thermal processing apparatus was mentioned as an example, in which the resistance heater 4 shielding over the upper surface of the substrate 1 and the side surface thereof is arranged. The present invention can be applied to all of thermal processing apparatuses wherein heat is radiated uniformly into the substrate 1 from a direction of the upper surface of the substrate and from a direction of the side surface of the substrate. For example, in the thermal processing apparatus wherein the resistance heater 4 is arranged only over the substrate 1 and the hot wall 9 heated by the resistance heater 4 is arranged over the side of the substrate 1, the same effects as those of the present invention can be obtained by arranging the annular shielding unit 6 of the present invention so as to covers the side of the substrate 1. Also in the thermal processing apparatus wherein the resistance heater 4 is arranged only over the side of the substrate 1 and a hot wall 9 heated by the resistance heater 4 is arranged over the substrate 1, the same effects as those of the present invention can be obtained by arranging the annular shielding unit 6 of the present invention so as to cover the side of the substrate 1.

Furthermore, the descriptions of the foregoing embodiments were made as to the thermal processing apparatuses for processing a sheet of the substrate 1. It is possible to apply the present invention to a thermal processing apparatus for simultaneously processing a plurality of substrates. In this case, it is possible to arrange the shielding unit 6 of the present invention for each substrate 1 as well as to arrange the single shielding unit 6 for the plurality of the substrates.

As described above, according to the shielding unit, the thermal processing apparatus, and the thermal processing method of the present invention, it is possible to enhance uniformity of the temperature rising rate of the substrate and uniformity of the temperature of the substrate.

Although the preferred embodiments of the present invention have been described in detail, it should be understood that various changes, substitutions and alternations can be made therein without departing from the spirit and scope of the inventions as defined by the appended claims.

What is claimed is:

1. A thermal processing apparatus, comprising:
   a substrate holding unit for holding a substrate having an edge portion during thermal processing;
   a heater arranged to heat said substrate; and
   a shield between the heater and the substrate, the shield being arranged to shield heat from the heater from reaching the edge portion of the substrate,
   wherein the shield comprises a first portion and a second portion, the first portion having a high absorbtivity and the second portion having a low absorbtivity.

2. The thermal processing apparatus as claimed in claim 1, wherein the first portion faces the edge of the substrate and the second portion faces the heater.

3. The thermal processing apparatus as claimed in claim 1, wherein the second portion faces the edge of the substrate and the first portion faces the heater.

4. The thermal processing apparatus as claimed in claim 1, wherein the shield comprises a first portion and second portion, the first portion having a high relative heat transmission property and the second portion having a low relative heat transmission property.

5. The thermal processing apparatus as claimed in claim in 4, wherein the first portion faces the edge of the substrate and the second portion faces the heater.

6. The thermal processing apparatus as claimed in claim 4, wherein the second portion faces the edge of the substrate and the first portion faces the heater.

7. The thermal processing apparatus as claimed in claim 1, wherein the first portion comprises quartz or bubbled quartz, and wherein the second portion comprises SiC.

8. The thermal processing apparatus as claimed in claim 1, wherein the shield is an annular body.

9. A thermal processing apparatus, comprising:
   a substrate holding unit for holding a substrate having an edge portion during thermal processing;
   a heater arranged to heat the substrate; and
   a heat shield; and
   means for moving the shield between a first position and a second position, wherein when the shield is at the first position, a portion of the shield is between the edge of the substrate and the heaters, and when the shield is at the second position, no portion of the shield is between the edge of the substrate and the heater.

10. The thermal processing apparatus as claimed in claim 9, further comprising a housing containing the substrate holding unit, the heater being outside of the housing.

11. The thermal processing apparatus as claimed in claim 10, wherein the shield is inside of the housing.

12. The thermal processing apparatus as claimed in claim 10, wherein the shield is outside of the housing.

13. The thermal processing apparatus as claimed in claim 9, further comprising means for moving the substrate holding unit between a first and a second position, the first position being relatively near the heater and the second position being relatively away from the heater.

14. The thermal processing apparatus as claimed in claim 13, wherein the means for moving the substrate holding unit and the means for moving the shield are arranged to move the substrate holding unit and the shield independently.

15. The thermal processing apparatus as claimed in claim 9, wherein the shield comprises a first portion and a second portion, the first portion having a high absorptivity and the second portion having a low absorptivity.

16. The thermal processing apparatus as claimed in claim 15, wherein the first portion faces the edge of the substrate and the second portion faces the heater.

17. The thermal processing apparatus as claimed in claim 15, wherein the second portion faces the edge of the substrate and the first portion faces the heater.

18. The thermal processing apparatus as claimed in claim 9, wherein the shield comprises a first portion and a second portion, the first portion having a high relative heat transmission property and the second portion having a low relative heat transmission property.

19. The thermal processing apparatus as claimed in claim 18, wherein the first portion faces the edge of the substrate and the second faces the heater.

20. The thermal processing apparatus as claimed in claim 18, wherein the second portion faces the edge of the substrate and the first portion faces the heater.

21. The thermal processing apparatus as claimed in claim 15, wherein, the first portion comprises quartz or bubbled quartz, and wherein the second portion comprises SiC.

22. The thermal processing apparatus as claimed in claim 9, wherein the shield is an annular body.

23. A thermal processing method, comprising the steps of:
   moving a substrate having an edge portion close to a heat source;
   moving a shield close to the heat source between the heat source and an edge of the substrate;
   initially heating the substrate with the heater while the shield is between the edge of the substrate and the heater;
   moving the shield away from the heater after initially heating the substrate; and heating the substrate with the heater while the shield is not between the edge of the substrate and the heater.

24. The method recited in claim 23, wherein the step of moving the substrate close to the heat source and the step of moving the shield close to the heat source occur simultaneously.

* * * * *